(12) United States Patent
Jung et al.

(10) Patent No.: US 10,153,235 B2
(45) Date of Patent: Dec. 11, 2018

(54) IMAGE SENSOR DEVICE AND IMAGE SENSOR MODULE COMPRISING THE SAME

(71) Applicant: SAMSUNG ELECTRO-MECHANICS CO., LTD., Suwon-si, Gyeonggi-do (KR)

(72) Inventors: Dae Kwon Jung, Suwon-si (KR); Bang Chul Ko, Suwon-si (KR); Chul Choi, Suwon-si (KR); Jung Hyun Cho, Suwon-si (KR); Joo Hwan Jung, Suwon-si (KR); Yong Ho Baek, Suwon-si (KR); Seung Eun Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/681,839

(22) Filed: Aug. 21, 2017

(65) Prior Publication Data
US 2018/0130750 A1    May 10, 2018

(30) Foreign Application Priority Data

Nov. 10, 2016 (KR) .................. 10-2016-0149833
Dec. 23, 2016 (KR) .................. 10-2016-0178488

(51) Int. Cl.
*H01L 23/538* (2006.01)
*H01L 23/31* (2006.01)
(Continued)

(52) U.S. Cl.
CPC ...... *H01L 23/5389* (2013.01); *H01L 23/3114* (2013.01); *H01L 23/5383* (2013.01);
(Continued)

(58) Field of Classification Search
CPC ............. H01L 23/5389; H01L 23/5383; H01L 23/5386; H01L 23/562
(Continued)

(56) References Cited

U.S. PATENT DOCUMENTS

| 2008/0017941 A1 | 1/2008 | Yang et al. |
| 2008/0308928 A1 | 12/2008 | Chang et al. |
| 2012/0133001 A1 | 5/2012 | Tkaczyk et al. |
| 2016/0255296 A1 | 9/2016 | Iwabuchi et al. |

FOREIGN PATENT DOCUMENTS

| JP | 2001-339057 A | 12/2001 |
| JP | 2008-042899 A | 2/2008 |

(Continued)

OTHER PUBLICATIONS

Office Action issued in corresponding Japanese Patent Application No. 2017-157302, dated Oct. 16, 2018.

*Primary Examiner* — Anthony Ho
(74) *Attorney, Agent, or Firm* — McDermott Will & Emery LLP

(57) ABSTRACT

The present disclosure relates to an image sensor device including: a fan-out semiconductor package including a first semiconductor chip having an active surface on which a connection pad is disposed, a first connection member disposed on the active surface and including a redistribution layer electrically connected to the connection pad of the first semiconductor chip, and a sealing material disposed on the first connection member and sealing at least a portion of the first semiconductor chip, a second semiconductor chip disposed on the first connection member and electrically connected to the first connection member; and a third semiconductor chip disposed on the second semiconductor chip and electrically connected to the second semiconductor chip, in which at least one of the second semiconductor chip or the third semiconductor chip may be an image sensor. The present disclosure also relates to an image sensor module including the image sensor device.

17 Claims, 17 Drawing Sheets

(51) Int. Cl.
*H01L 23/00* (2006.01)
*H01L 27/146* (2006.01)
*H04N 5/225* (2006.01)
*H04N 5/335* (2011.01)

(52) U.S. Cl.
CPC ........ *H01L 23/5386* (2013.01); *H01L 23/562* (2013.01); *H01L 24/20* (2013.01); *H01L 27/14618* (2013.01); *H01L 27/14634* (2013.01); *H01L 27/14636* (2013.01); *H04N 5/2253* (2013.01); *H04N 5/2257* (2013.01); *H04N 5/335* (2013.01); *H01L 2224/214* (2013.01); *H01L 2924/146* (2013.01); *H01L 2924/1431* (2013.01); *H01L 2924/1434* (2013.01); *H01L 2924/3511* (2013.01)

(58) Field of Classification Search
USPC .......................................................... 257/433
See application file for complete search history.

(56) References Cited

FOREIGN PATENT DOCUMENTS

| | | |
|---|---|---|
| JP | 2011-003961 A | 1/2011 |
| JP | 2012-118060 A | 6/2012 |
| JP | 2013-179313 A | 9/2013 |
| JP | 2013-183425 A | 9/2013 |
| JP | 2015-065479 A | 4/2015 |
| JP | 2015-088498 A | 5/2015 |
| JP | 2015-179859 A | 10/2015 |
| JP | 2016-048720 A | 4/2016 |

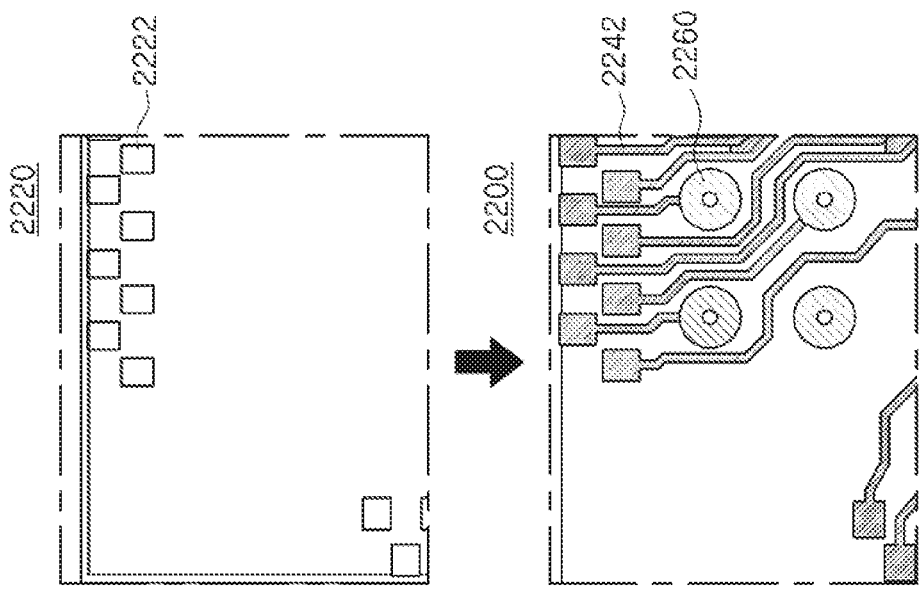
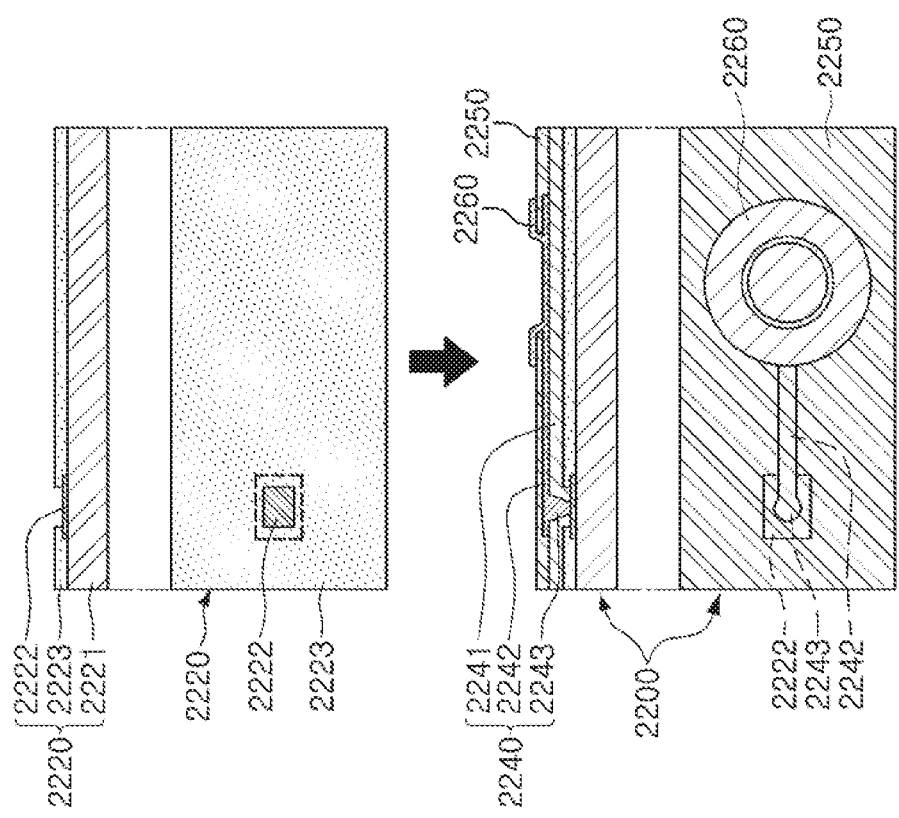
FIG. 3B
FIG. 3A

IMAGE SENSOR DEVICE AND IMAGE SENSOR MODULE COMPRISING THE SAME

CROSS-REFERENCE TO RELATED APPLICATION(S)

This application claims benefit of priority to Korean Patent Application Nos. 10-2016-0149833 filed on Nov. 10, 2016 and 10-2016-0178488 filed on Dec. 23, 2016 in the Korean Intellectual Property Office, the disclosures of which are incorporated herein by reference in its entirety.

TECHNICAL FIELD

The present disclosure relates to an image sensor device used in a camera module or the like and an image sensor module using the image sensor device as a sensor package.

BACKGROUND

The miniaturization and implementation of high performance in electronic components used in mobile products such as smartphones and tablet PCs have been continuously demanded. That is, efforts are being made to manufacture electronic components having a small size and with greater functionality occupying the same amount of space as existing components, or the like. In particular, demand for miniaturization of components having additional functions other than main components is increasing. For example, demand for miniaturization, high performance, multifunctionality in an image sensor device used in a camera module or the like is also increasing.

SUMMARY

An aspect of the present disclosure may provide an image sensor device having a novel structure realizing miniaturization, high performance, and multifunctionality and an image sensor module comprising the same.

According to an aspect of the present disclosure, a first semiconductor chip packaged in a fan-out form may be connected to a second semiconductor chip and a third electrically conducted to each other, one of which serving as a semiconductor chip, such that miniaturization, high performance, and multifunctionality may be implemented in one device.

According to an aspect of the present disclosure, an image sensor device may include: a fan-out semiconductor package including a first semiconductor chip having an active surface on which a connection pad is disposed, a first connection member disposed on the active surface of the first semiconductor chip and including a redistribution layer electrically connected to the connection pad of the first semiconductor chip, and a sealing material disposed on the first connection member and sealing at least a portion of the first semiconductor chip; a second semiconductor chip disposed on the first connection member and electrically connected to the first connection member; and a third semiconductor chip disposed on the second semiconductor chip and electrically connected to the second semiconductor chip, in which at least one of the second semiconductor chip or the third semiconductor chip may be an image sensor.

According to another aspect of the present disclosure, an image sensor module may include a circuit board having a through hole while being formed with a circuit pattern and an image sensor device disposed in the through hole of the circuit board and electrically connected to the circuit pattern of the circuit board, in which the image sensor device may be the foregoing image sensor device and at least one of the second semiconductor chip or the third semiconductor chip may be an image sensor.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are cross-sectional views schematically illustrating a fan-in semiconductor that is not packaged and a packaged fan-in semiconductor package;

DETAILED DESCRIPTION

Hereinafter, exemplary embodiments in the present disclosure will be described in detail with reference to the accompanying drawings. In the accompanying drawings, shapes and dimensions of components may be exaggerated or reduced for clarity.

Electronic Device

Figure 1:
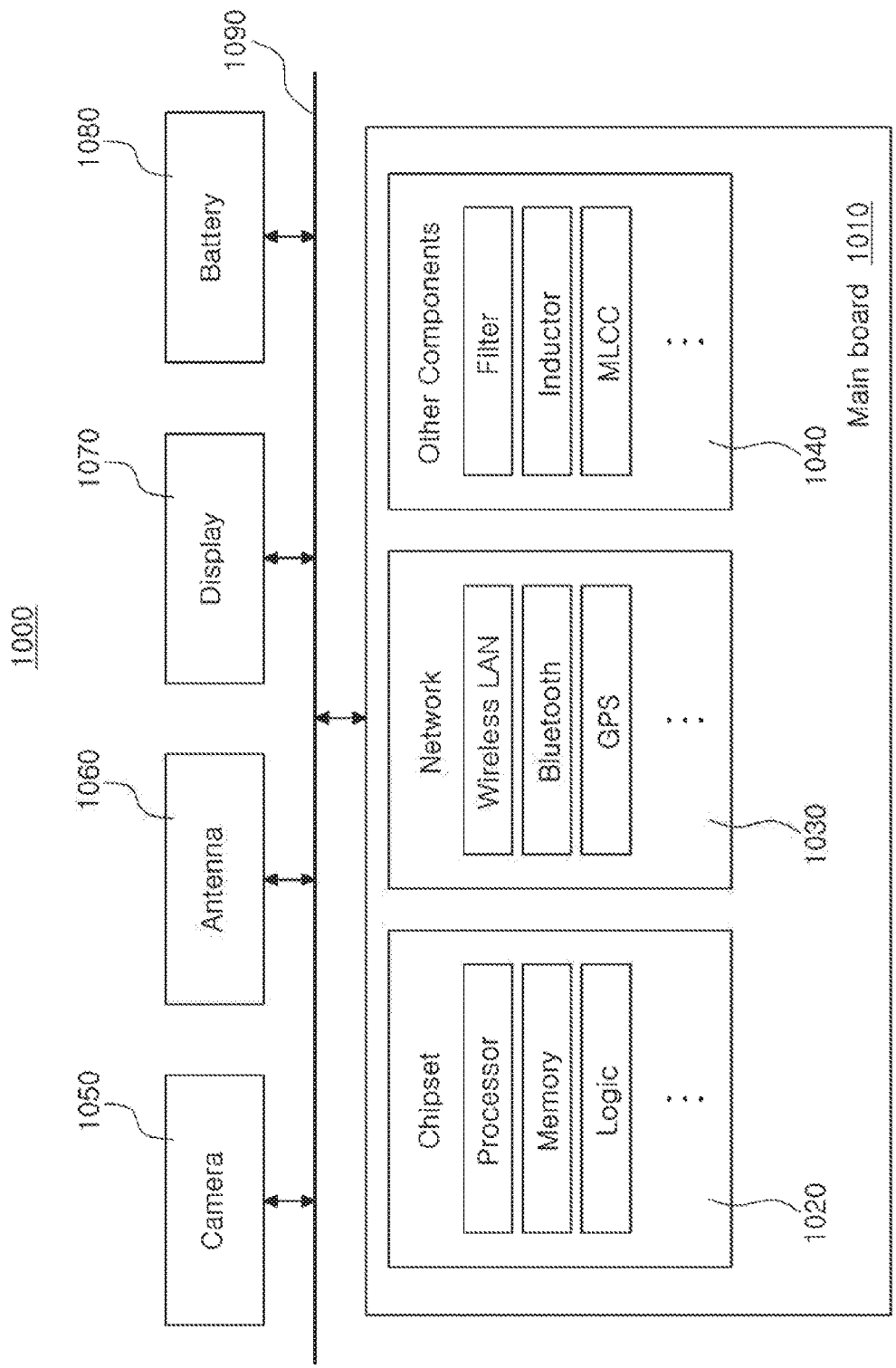
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010. The main board 1010 is physically and/or electrically connected to a chip-related component 1020, a network-related component 1030, other components 1040 or the like. These components may be also coupled to other components described below to form various signal lines 1090.

The chip-related component 1020 may include a memory chip such as a volatile memory (e.g., DRAM), a non-volatile memory (e.g., ROM), and flash memory, an application processor chip such as a central processor (e.g., a CPU), a graphics processor (e.g., a GPU), a digital signal processor, a cryptographic processor, a microprocessor, and a microcontroller, a logic chip such as an analog-to-digital converter and an application-specific integrated circuit (ASIC), or the like but is not limited thereto. Therefore, other types of chip-related components may be included. Further, the components 1020 may be combined with each other.

The network-related component 1030 may include WiFi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, and 5G and any other wireless or wired protocols designated beyond but is not limited thereto. Therefore, the network-related component 1030 may include any of other wireless or wired standards or protocols. Further, the network-related component 1030 may be combined with the chip-related component 1020.

The other components 1040 may include a high frequency inductor, a ferrite inductor, a power inductor, ferrite beads, low temperature co-firing ceramics (LTCC), an electromagnetic interference (EMI) filter, and a multilayer ceramic condenser (MLCC) or the like but are not limited thereto. Therefore, the other components 1040 may include a passive component used for various other purposes. Further, the other components 1040 may be combined with the chip-related component 1020 and/or the network-related component 1030.

Depending on the type of electronic device 1000, the electronic device 1000 may include other components that may or may not be physically and/or electrically connected to the main board 1010. Other components include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (e.g., hard disk drive) (not shown), a compact disc (CD) (not shown), and a digital versatile disk (DVD) (not shown) or the like but are not limited thereto. Therefore, depending on the type of electronic device 1000, other components or the like used for various purposes may be included.

The electronic device 1000 may be a smartphone, a personal digital assistant, a digital video camera, a digital still camera, a network system, a computer, a monitor, a tablet, a laptop, a netbook, a television, a video game, a smart watch, an automotive component or the like. However, the electronic device 1000 is not limited thereto. Therefore, the electronic device 1000 may be any other electronic devices for processing data.

Figure 2:
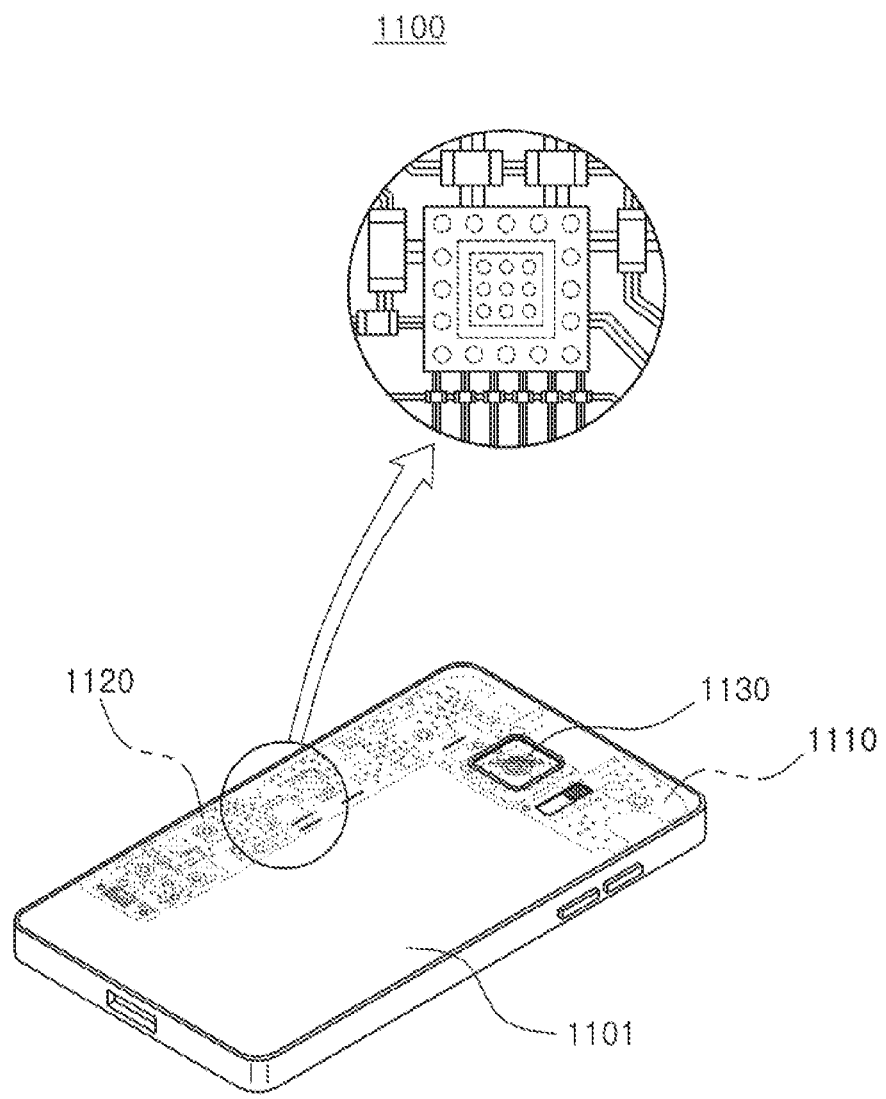
FIG. 2 is a perspective view schematically illustrating an example of an electronic device.

FIG. 2 is a perspective view schematically illustrating an example of an electronic device.

Referring to FIG. 2, a semiconductor package is applied to various electronic devices as described above for various purposes. For example, a main board 1110 may be received in a body 1101 of a smartphone 1100, and various components 1120 may be physically and/or electrically connected to the main board 1110. Further, other components such as the camera 1130, which may or may not be physically and/or electrically connected to the main board 1110, are received in the body 1101. The electronic device is not necessarily limited to the smartphone 1100 but may be other electronic devices as described above.

Semiconductor Package

In general, a semiconductor chip may have scores of microelectronic circuits integrated therein but the semiconductor chip itself may not serve as a finished product of a semiconductor, and may be damaged by an external physical or chemical impact. Accordingly, the semiconductor chip itself may not be used as it is. For this reason, the semiconductor chip may be packaged and thus has been used for electronic devices or the like in the packaged state.

The reason why the semiconductor packaging is required is that there is a difference in a circuit width between the semiconductor chip and the main board of the electronic device in terms of an electrical connection. Specifically, in the case of the semiconductor chip, a size of connection pads and an interval between the connection pads are very small. On the other hand, in the case of the main board used for the electronic device, a size of component mounting pads and an interval between the component mounting pads may be much larger than a scale of the semiconductor chip. Therefore, a need exists for a packaging technology capable of buffering the difference in the circuit width between the semiconductor chip and the main board because it is difficult to directly mount the semiconductor chip on the main board. The semiconductor package manufactured by the packaging technology may be classified as a fan-in semiconductor package or a fan-out semiconductor package, depending on the structure and purpose.

Hereinafter, the fan-in semiconductor package and the fan-out semiconductor package will be described in more detail with reference to the drawings.

Fan-In Semiconductor Package

FIGS. 3A and 3B are cross-sectional views schematically illustrating a fan-in semiconductor that is not packaged and a packaged fan-in semiconductor.

Figure 4:
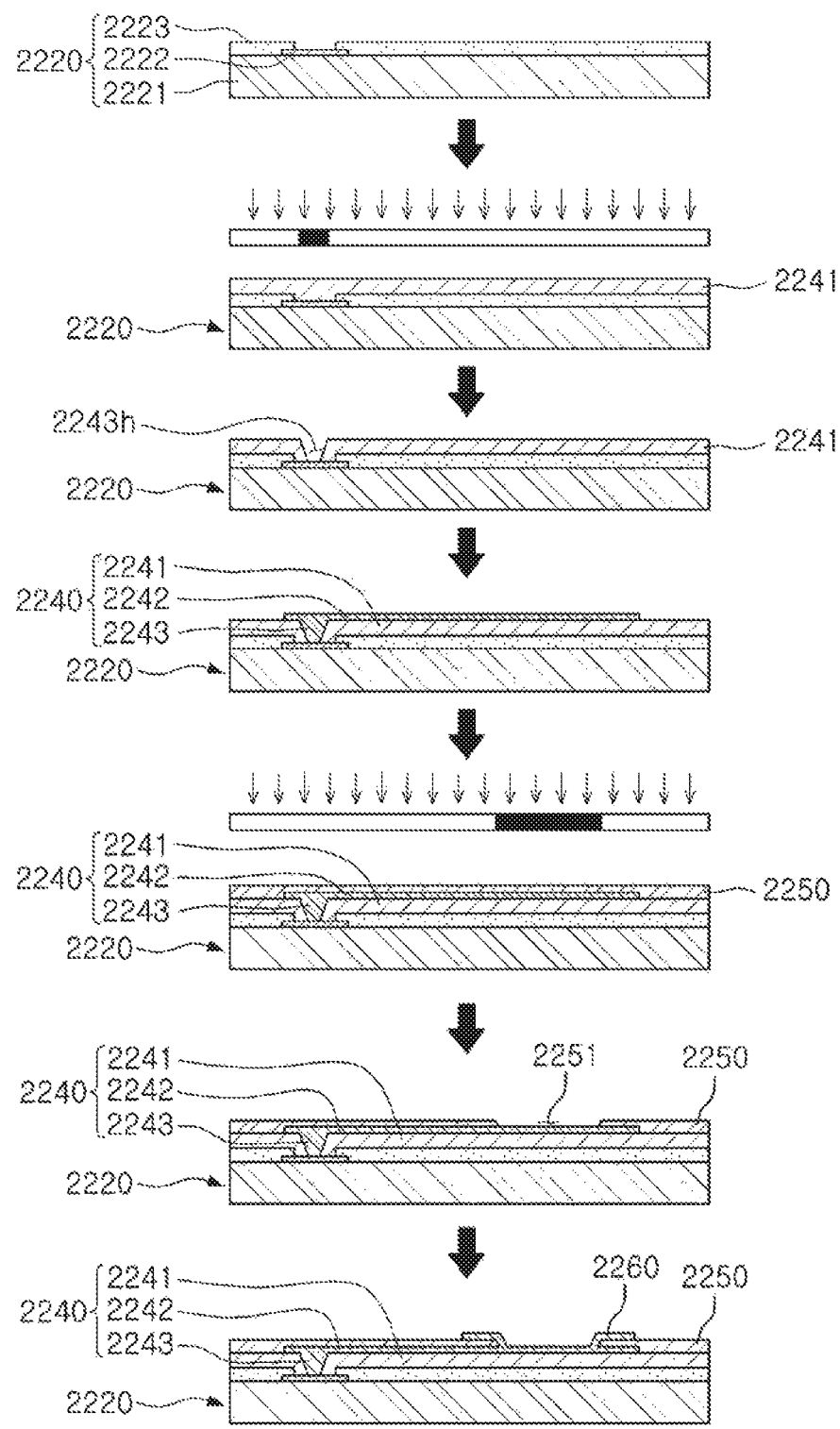
FIG. 4 is a cross-sectional view schematically illustrating a process of packaging the fan-in semiconductor package.

FIG. 4 is a cross-sectional view schematically illustrating a process of packaging the fan-in semiconductor.

Referring to FIGS. 3A to 4, a semiconductor chip 2220 may be an integrated circuit (IC) in, for example, a bare state that includes a body 2221 including silicon (Si), germanium (Ge), gallium arsenide (GaAs) or the like, a connection pad 2222 including a conductive material such as aluminum (Al) and the like formed on one surface of the body 2221, and a passivation film 2223 like an oxide film, a nitride film or the like formed on one surface of the body 2221 and covering at least a part of the connection pad 2222. At this point, since the connection pad 2222 is very small, the integrated circuit (IC) may be difficult to mount on an intermediate-level printed circuit board (PCB) as well as the main board of the electronic device or the like.

Therefore, a connection member 2240 may be formed on the semiconductor chip 2220 to fit the size of the semiconductor chip 2220 in order to redistribute the connection pad 2222. The connection member 2240 may be formed by forming an insulating layer 2241 of an insulating material such as a photo image dielectric (PID) resin on the semiconductor chip 2220, forming a via hole 2243h for opening the connecting pad 2222, and then forming a wiring pattern 2242 and a via 2243. Thereafter, a passivation layer 2250 for protecting the connection member 2240 may be formed, and an under bump metal layer 2260 or the like may be formed after the opening 2251 is formed. That is, a fan-in semiconductor package 2200 including, for example, the semiconductor chip 2220, the connection member 2240, the passivation layer 2250, and the under bump metal layer 2260 may be manufactured by a series of processes.

In this way, the fan-in semiconductor package may be a package type in which the connection pads of the semiconductor chip, for example, input/output (I/O) terminals are all disposed inside the device and may be manufactured cheaply while having good electrical characteristics. Accordingly, many devices mounted in a smartphone may be manufactured in the form of the fan-in semiconductor package. Specifically, they have been developed in order to be miniaturized and quickly transmit a signal.

However, the fan-in semiconductor package may have great spatial restrictions because all of the I/O terminals need to be disposed inside the semiconductor chip. Therefore, the structure may be difficult to apply to a semiconductor chip having a large number of I/O terminals or a semiconductor chip having a small size. In addition, due to the disadvantages, the fan-in semiconductor package may not be used while being directly mounted on the main board of the electronic device. Here, even if the size and interval of the I/O terminals of the semiconductor chip are expanded by the redistribution process, the I/O terminals may not have a sufficient size or interval to be directly mounted on the main board of the electronic device.

Figure 5:
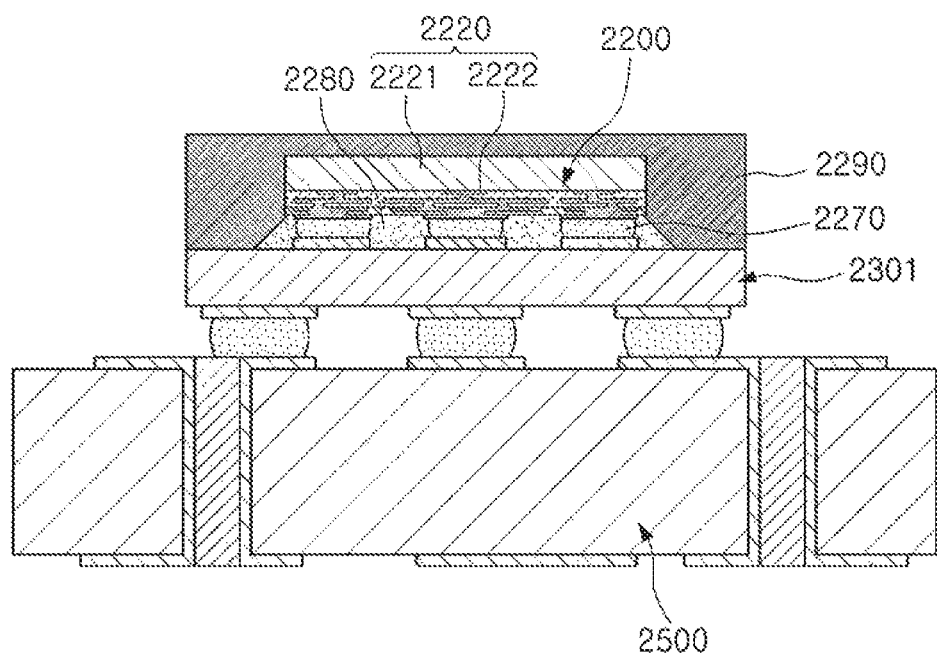
FIG. 5 is a cross-sectional view schematically illustrating a case in which the fan-in semiconductor package is mounted on an interposer substrate and ultimately mounted on a main board of an electronic device.

FIG. 5 is a cross-sectional view schematically illustrating a case in which the fan-in semiconductor package is mounted on an interposer substrate and ultimately mounted on a main board of an electronic device.

Figure 6:
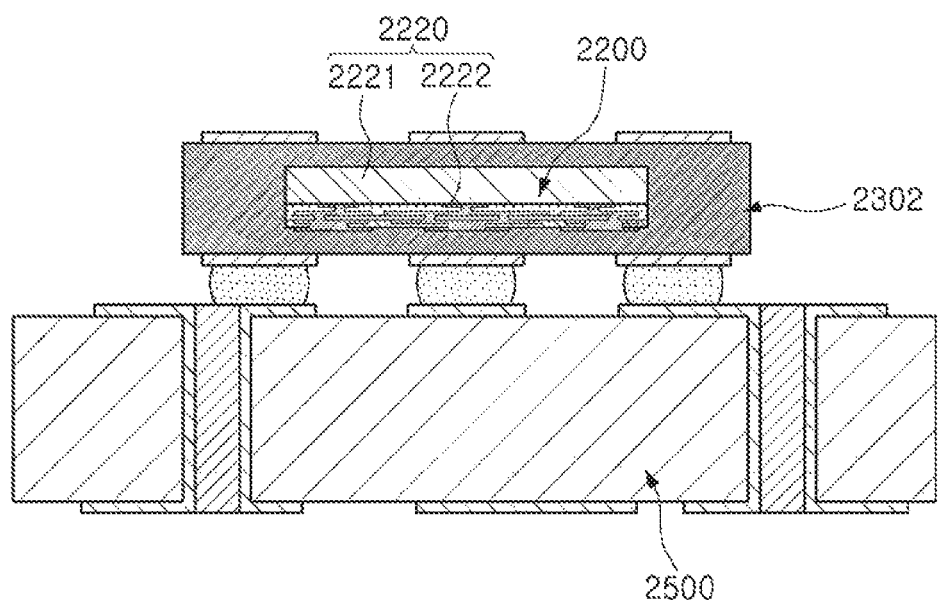
FIG. 6 is a cross-sectional view schematically illustrating a case in which the fan-in semiconductor package is embedded in an interposer substrate and ultimately mounted on the main board of the electronic device.

FIG. 6 is a cross-sectional view schematically illustrating a case in which the fan-in semiconductor package is embedded in an interposer substrate and ultimately mounted on the main board of the electronic device.

Referring to FIGS. 5 and 6, the fan-in semiconductor package 2200 may be mounted on a main board 2500 of the electronic device in a state in which the connection pads 2222 of the semiconductor chip 2220, that is, the I/O terminals are redistributed once again through an interposer substrate 2301 and the fan-in semiconductor package 2200 is ultimately mounted on the main board 2500 of the electronic device in the state in which the fan-in semiconductor package 2200 is mounted on the interposer substrate 2301. At this point, a solder ball 2270 or the like may be fixed with an underfill resin 2280 or the like, and an external surface thereof may be covered with a molding material 2290 or the like. Alternatively, the fan-in semiconductor package 2200 may also be embedded in a separate interposer substrate 2302, and the connection pads 2222 of the semiconductor chip 2220, that is, the I/O terminals 2222 may be redistributed once again by the interposer substrate 2302 in the embedded state and ultimately mounted on the main board 2500 of the electronic device.

In this way, since the fan-in semiconductor package is difficult to be used while being directly mounted on the main board of the electronic device, the fan-in semiconductor package may be mounted on a separate interposer substrate and then again mounted on the main board of the electronic device by the packaging process or may be mounted on the main board of the electronic device while being embedded in the interposer substrate and used.

Fan-Out Semiconductor Package

Figure 7:
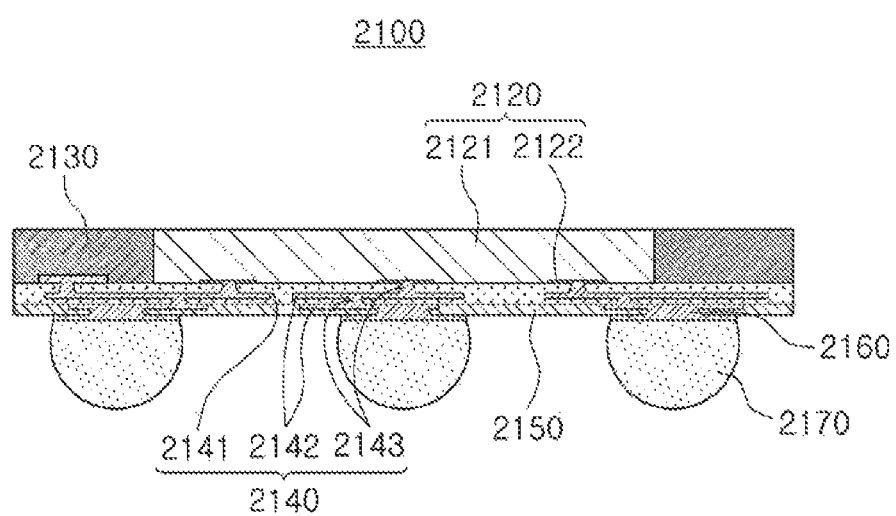
FIG. 7 is a cross-sectional view schematically illustrating a fan-out semiconductor package.

FIG. 7 is a cross-sectional view schematically illustrating a fan-out semiconductor package.

Referring to FIG. 7, the fan-out semiconductor package 2100, for example, an external surface of the semiconductor chip 2120 is protected by the sealing material 2130, and the connection pad 2122 of the semiconductor chip 2120 is redistributed up to an external surface of the semiconductor chip 2120 by the connection member 2140. At this point, a passivation layer 2150 may be further formed on the connection member 2140, and an under bump metal layer 2160 may be further formed on an opening of the passivation layer 2150. A solder ball 2170 may be further formed on the under bump metal layer 2160. The semiconductor chip 2120 may be an integrated circuit (IC) including a body 2121, a connection pad 2122, a passivation film (not shown), or the like. The connection member 2140 includes an insulating layer 2141, a redistribution layer 2142 formed on the insulating layer 2141, and a via 2143 for electrically connecting between the connecting pad 2122 and the redistribution layer 2142 or the like.

As described above, the fan-out semiconductor package is formed by redistributing the I/O terminals to the outside of the semiconductor chip through the connection member formed on the semiconductor chip. As described above, in the fan-in semiconductor package, all of the I/O terminals of the semiconductor chip need to be disposed inside the semiconductor chip, and therefore a ball size and pitch need to be reduced as an element size is reduced, such that a standardized ball layout may not be used. On the other hand, the fan-out semiconductor package is formed by redistributing the I/O terminals up to the outside of the semiconductor chip through the connection member formed on the semiconductor chip, and therefore may use the standardized ball layout as it is even if the size of the semiconductor chip is reduced. Therefore, as will be described below, the fan-out semiconductor package may be mounted on the main board of the electronic device without using the separate interposer substrate.

Figure 8:
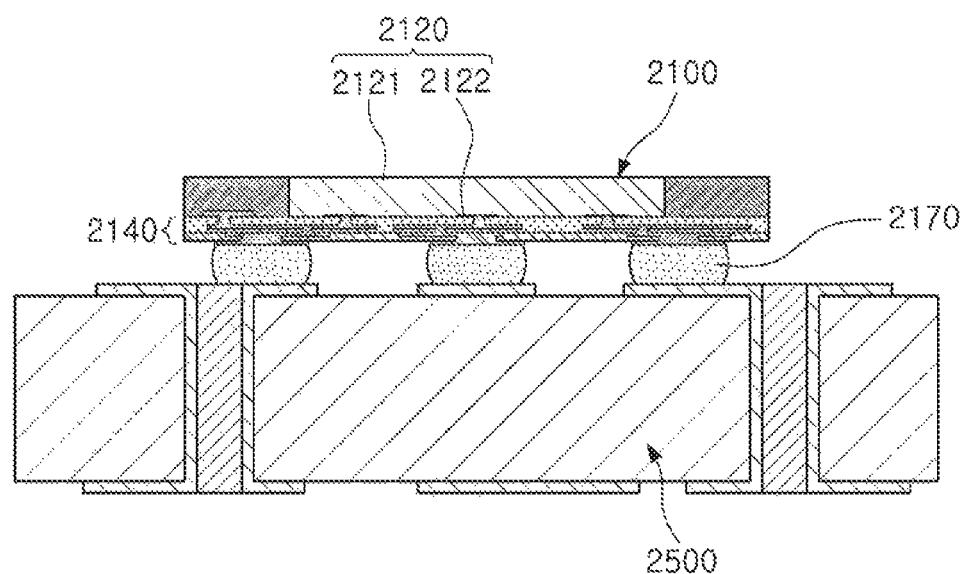
FIG. 8 is a cross-sectional view schematically illustrating a case in which the fan-out semiconductor package is mounted on a main board of an electronic device.

FIG. 8 is a cross-sectional view schematically illustrating a case in which the fan-out semiconductor package is mounted on a main board of an electronic device.

Referring to FIG. 8, the fan-out semiconductor package 2100 may be mounted on the main board 2500 of the electronic device through the solder ball 2170 or the like. That is, as described above, since the fan-out semiconductor package 2100 includes the connection member 2140 that can redistribute the connection pad 2122 to a fan-out area that is outside of the size of the semiconductor chip 2120, the standardized ball layout may be used intact as it is, such that the fan-out semiconductor package 2100 may be mounted on the main board 2500 of the electronic device without the separate interposer substrate or the like.

In this way, since the fan-out semiconductor package may be mounted on the main board of the electronic device without using the separate interposer substrate, the fan-out semiconductor package may be formed to be thinner than the fan-in semiconductor package using the interposer substrate, and as a result may be miniaturized and thinned. In addition, the fan-out semiconductor package may have excellent thermal and electrical properties, and as a result may be particularly suitable for mobile products. In addition, the fan-out semiconductor package may be implemented to be more compact than a general package on package (POP) type package using a printed circuit board (PCB), and solve a problem caused by a warpage phenomenon.

On the other hand, the fan-out semiconductor package refers to a package technology for mounting the semiconductor chip on the main board or the like of the electronic device and protecting the semiconductor chip from external impacts, and therefore may be different from the fan-in semiconductor package in terms of scale, purpose or the like, and may have different concepts from the printed circuit board (PCB) such as the interposer substrate in which the fan-in semiconductor package is embedded.

Image Sensor Device

Figure 9:
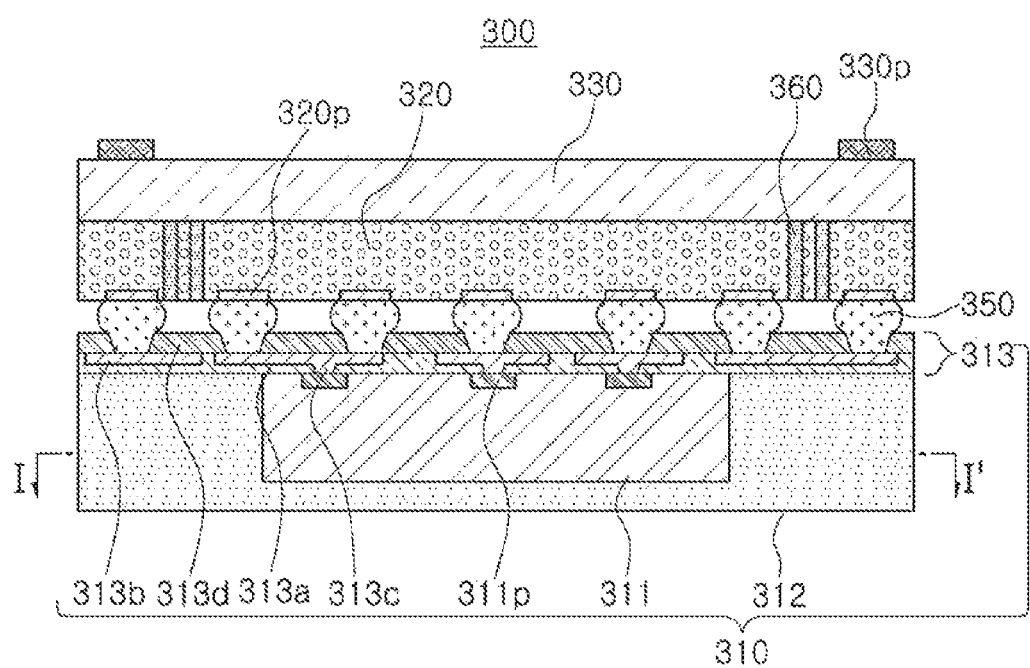
FIG. 9 is a cross-sectional view schematically illustrating an image sensor device according to an example.

FIG. 9 is a cross-sectional view schematically illustrating an image sensor device according to an example.

Figure 10:
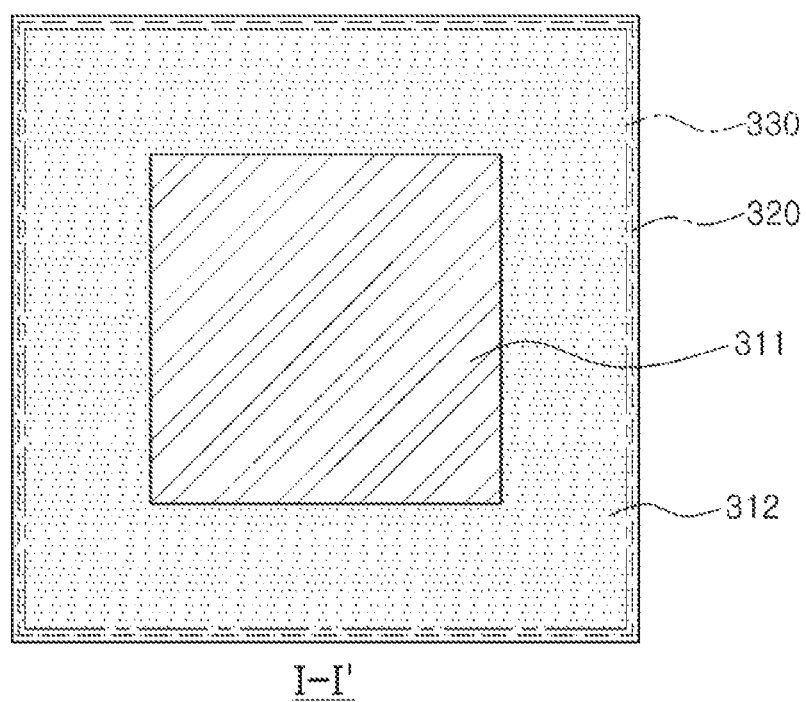
FIG. 10 is a schematic cutaway plan view of the image sensor device of FIG. 9 taken along the line I-I'.

FIG. 10 is a schematic cutaway plan view of the image sensor device of FIG. 9 taken along the line I-I'.

Referring to FIGS. 9 and 10, an image sensor device 300 according to an example may include a fan-out semiconductor package 310 including a first semiconductor chip 311 having an active surface on which a connection pad 311p is disposed, a connection member 313 disposed on the active surface of the first semiconductor chip 311 and including a redistribution layer 313b electrically connected to the connection pad 311p, and a sealing material 312 disposed on the connection member 313 and sealing at least a portion of the first semiconductor chip 311, a second semiconductor chip 320 disposed on the connection member 313 and electrically connected to the connection member 313 by a connector 350, and a third semiconductor chip 330 disposed on the second semiconductor chip 320 and electrically connected to the second semiconductor chip 320 through a through electrode 360. In this case, at least one of the second semiconductor chip 320 or the third semiconductor chip 330 may be an image sensor.

Recently, the miniaturization and high performance of electronic components used in mobile products such as a smartphone and a tablet have been continuously demanded. In particular, demand for miniaturization of components having additional functions other than main components is increasing. For example, demand for miniaturization, high performance and multifunctionality of an image sensor device used in a camera module and the like is also increasing. As one method for satisfying such demands, a method of stacking a plurality of wafers to manufacture a downsized, high-performance, and multifunctional image sensor device may be considered. For example, a method of forming a second wafer including a plurality of logics on a first wafer, including a plurality of sensors, forming a third wafer including a plurality of memories on two-stacked wafers, and then electrically connecting between the second wafer and the third wafer by a through electrode. However, when the through electrode is formed on three-stacked wafers, if the through electrode is defective, all three-stacked wafers need to be discarded, and therefore the yield may be lowered. In addition, in the case of the three-stacked wafer, the size of the memory needs to be formed depending on the size of the sensor or the logic, and therefore the number of memories that may be formed on the wafer may be limited and productivity may be reduced.

On the other hand, the image sensor device 300 according to an example may be manufactured by packaging the first semiconductor chip 311 such as a memory in a fan-out form to manufacture the fan-out semiconductor package 310 separately and connecting the fan-out semiconductor package 310 to the wafer including the second semiconductor chip 320 such as logic and the third semiconductor chip 330 such as a sensor by the connector 350. That is, the image sensor device 300 may be manufactured in a two-stack manner. Therefore, it is possible to minimize the reduction in the yield due to the poor formation of the through electrode or the like. In addition, since the image sensor device 300 according to an example packages the first semiconductor chip 311 in a fan-out shape, the size of the first semiconductor chip 311 may be implemented to be smaller than that of the second semiconductor chip 320 or the third semiconductor chip 330 with respect to a horizontal cross sectional area as shown in FIG. 10. Therefore, a larger number of first semiconductor chips 311 may be formed on the wafer than the second and third semiconductor chips 320 and 330, thereby considerably increasing productivity. By doing so, the high-performance and multifunctional image sensor device 300 may be manufactured with high yield and high productivity despite the miniaturization.

Hereinafter, each component in the image sensor device 300 according to the example will be described in more detail.

The fan-out semiconductor package 310 may include the first semiconductor chip 311 having the active surface on which the connection pad 311p is disposed and an inactive surface disposed on an opposite side of the active surface, the connection member 313 disposed on the active surface of the first semiconductor chip 311 and including the redistribution layer 311b electrically connected to the connection pad 311p of the first semiconductor chip 311, and the sealing member 312 disposed on the connection member 313 and sealing at least a part of the inactive surface of the first semiconductor chip 311.

The first semiconductor chip 311 may be a memory such as a volatile memory (e.g., DRAM), a non-volatile memory (e.g., ROM), and a flash memory, preferably, a DRAM, but is not limited thereto. The first semiconductor chip 311 may be a form of an integrated circuit (IC). In this case, a body of the first semiconductor chip 311 may be formed of silicon (Si), germanium (Ge), gallium arsenide (GaAs) or the like. The connection pad 311p may include the connection pad 311p formed of a conductive material such as aluminum (Al). In the first semiconductor chip 311, the surface on which the connection pad 311p is formed becomes the active surface and the surface opposite to the active surface becomes the inactive surface. Various circuits may be formed inside the body.

The sealing material 312 seals at least a portion of the first semiconductor chip 311. The sealing form is not particularly limited and therefore any sealing form that may cover at least a portion of the first semiconductor chip 311 may be allowed. For example, the sealing material 312 may cover at least a part of a side surface and the inactive surface of the first semiconductor chip 311. The sealing material 312 may include an insulating material. As the insulating material, a material including an inorganic filler and an insulating resin may be used. For example, a thermosetting resin such as an epoxy resin, a thermoplastic resin such as polyimide, or a resin that a reinforcing material such as an inorganic filler is added to the thermosetting resin and the thermoplastic resin, specifically, ajinomoto build-up film (ABF), or the like may be used. If necessary, the known epoxy molding compound (EMC) may also be used. If necessary, a material that the thermosetting resin or the thermoplastic resin is impregnated in a core material such as an inorganic filler and/or a glass fiber (glass cloth, glass fabric) may be used.

The connection member 313 may redistribute the connection pad 311p of the first semiconductor chip 311. The plurality of connection pads 311p having various functions may be redistributed through the connection member 313 and may be electrically connected to the second semiconductor chip 320 by the connector 350 according to the function. The connection pads 320p and 330p of each of the second and third semiconductor chips 320 and 330 may also be redistributed by the connection member 313 as needed. The connection member 313 may include an insulating layer 313a, the redistribution layer 313b formed on the insulating layer 313a, a via 313c penetrating through the insulating layer 313a and connected to the redistribution layer 313b, and a passivation layer 313d disposed on the insulating layer 313a and exposing at least a part of the redistribution layer 313b. The number of layers of the connection members 313 is not particularly limited and may be variously changed according to design specifications.

As the material of the insulating layer 313a, an insulating material may be used. At this point, in addition to the above-mentioned insulating material, a photosensitive insulating material like a PID resin may be used as the insulating material. That is, the insulating layer 313a may be a photosensitive insulating layer. If the insulating layer 313a has photosensitive properties, the insulating layer 313a may be formed to be thinner and a fine pitch of the via 313c may be more easily achieved. The insulating layer 313a may be a photosensitive insulating layer including an insulating resin and a base filler. If the insulating layer 313a is formed in multiple layers, these materials may be the same as each other or may be different from each other as needed. If the insulating layer 313a is formed in multiple layers, they may be integrated according to the process, and thus a boundary therebetween may be unclear.

The redistribution layer 313b may serve to redistribute the connection pad 313p or the like and may be formed of a conductive material such as copper (Cu), aluminum (Al), silver (Ag), tin (Sn), gold (Au), nickel (Ni), lead (Pb), and titanium (Ti) or alloys thereof. The redistribution layer 313b may perform various functions according to the design of the corresponding layer. For example, the redistribution layer 313b may include a ground (GND) pattern, a power (PWR) pattern, a signal (S) pattern or the like. Here, the signal (S) pattern may include various signals, for example, a data signal except for the ground (GND) pattern, the power (PWR) pattern, or the like. In addition, the signal (S) pattern may include various pad patterns such as a via pad and a connection terminal pad.

The vias 313c electrically connect the redistribution layers 313b, the connection pads 311p, or the like that are formed on different layers. As the formation material of the via 313c, a conductive material such as copper (Cu), aluminum (Al), silver (Ag), tin (Sn), gold (Au), nickel (Ni), lead (Pb), and titanium (Ti) or alloys thereof may be used. The via 313c may be completely filled with the conductive materials, or the conductive materials may be formed along a wall of the via. Further, as the shape of the via 313c, any known shape such as a tapered shape and a cylindrical shape may be applied.

The passivation layer 313d may be an additional component for protecting the redistribution layer 313b or the like from external physicochemical damage or the like. The passivation layer 313d may have an opening exposing at least a part of the redistribution layer 313b. Here, tens to thousands of openings may be formed in the passivation layer 313d. A material of the passivation layer 313d is not particularly limited. For example, a photosensitive insulating material such as the photo image dielectric resin may be used. Alternatively, a solder resist may be used. Alternatively, an insulating resin including a filler but not including a core material, for example, an ABF including an inorganic filler and an epoxy resin may be used.

The connector 350 may be a component for physically and electrically connecting the memory package 310 to the second semiconductor chip 320. The connector 350 may be formed of a conductive material, for example, a solder or the like. That is, the connector 350 may be a solder bump but is not limited thereto. The number, interval, arrangement type or the like of the connectors 350 are not particularly limited and may be sufficiently modified according to design specifications. At least one of the connectors 350 may be disposed in the fan-out area. The fan-out area may mean an area outside of the area in which the first semiconductor chip 311 is disposed. That is, the fan-out semiconductor package 310 may be the form of the image sensor device based on the first semiconductor chip 311.

The second semiconductor chip 320 may be logic such as an analog-to-digital converter and an application-specific integrated circuit (ASIC), preferably, the application specific integrated circuit (ASIC) but is not limited thereto. The second semiconductor chip 320 may also be a form of an integrated circuit. Therefore, the body of the second semiconductor chip 320 may be formed of silicon (Si), germanium (Ge), gallium arsenide (GaAs) or the like. The second semiconductor chip 320 may include the connection pad 320p formed of a conductive material such as aluminum (Al). In this case, the surface on which the connection pad 320p is formed becomes the active surface and the surface opposite to the active surface becomes the inactive surface. Various circuits may be formed inside the body. The connection pad 320p of the second semiconductor chip 320 may be connected to the connector 350. By doing so, the second semiconductor chip 320 may be physically and/or electrically connected to the fan-out semiconductor package 310.

The third semiconductor chip 330 may be an image sensor such as a complementary metal-oxide semiconductor (CMOS) sensor or a charge coupled device (CCD) sensor used for the camera module or the like, but may be another type of image sensor. The third semiconductor chip 330 may also be a form of an integrated circuit. Therefore, the body of the third semiconductor chip 330 may be formed of silicon (Si), germanium (Ge), gallium arsenide (GaAs) or the like. The third semiconductor chip 330 may include the connection pad 330p formed of a conductive material such as aluminum (Al). In this case, the surface on which the connection pad 330p is formed becomes the active surface and the surface opposite to the active surface becomes the inactive surface. Various circuits may be formed inside the body. Although not shown in the drawing, a microlens (not shown) may be disposed on the active surface of the third semiconductor chip 330. The microlens (not shown) may be the known lens applied to an image sensor. The inactive surface of the third semiconductor chip 330 may be in contact with the inactive surface of the second semiconductor chip 320. That is, the second semiconductor chip 320 and the third semiconductor chip 330 may be formed into a single chip form by being integrally manufactured in a wafer state and then cut in a dicing process or the like. However, the formation process of the second semiconductor chip 320 and the third semiconductor chip 330 is not limited thereto, and therefore the second semiconductor chip 320 and the third semiconductor chip 330 may be formed by being manufactured in the separate wafer state and then attaching each inactive surface using an adhesive member.

The through electrode 360 penetrates through at least the second semiconductor chip 320. The through electrode 360 may be the known through-silicon via (TSV). The second semiconductor chip 320 and the third semiconductor chip 330 may be electrically connected to each other through the through electrode 360. The through electrode 360 may be physically and/or electrically connected to the connection pad 320p of the second semiconductor chip 320 and/or the connection pad 330p of the third semiconductor chip 330. The number, arrangement, and penetration form or the like of the through electrodes 360 are not particularly limited and therefore may be changed according to design specifications of the second semiconductor chip 320 and the third semiconductor chip 330.

Figure 11A:
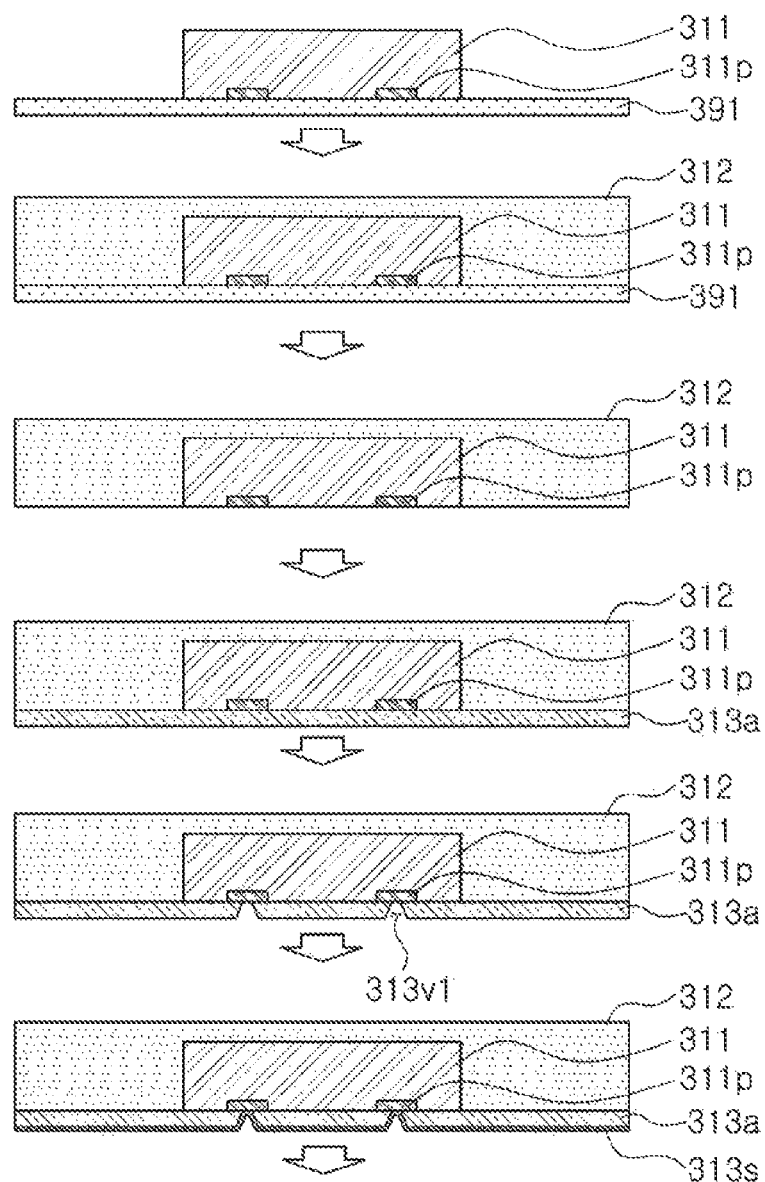
FIGS. 11A through 11C are schematic manufacturing examples of the image sensor device of FIG. 9.
Figure 11B:
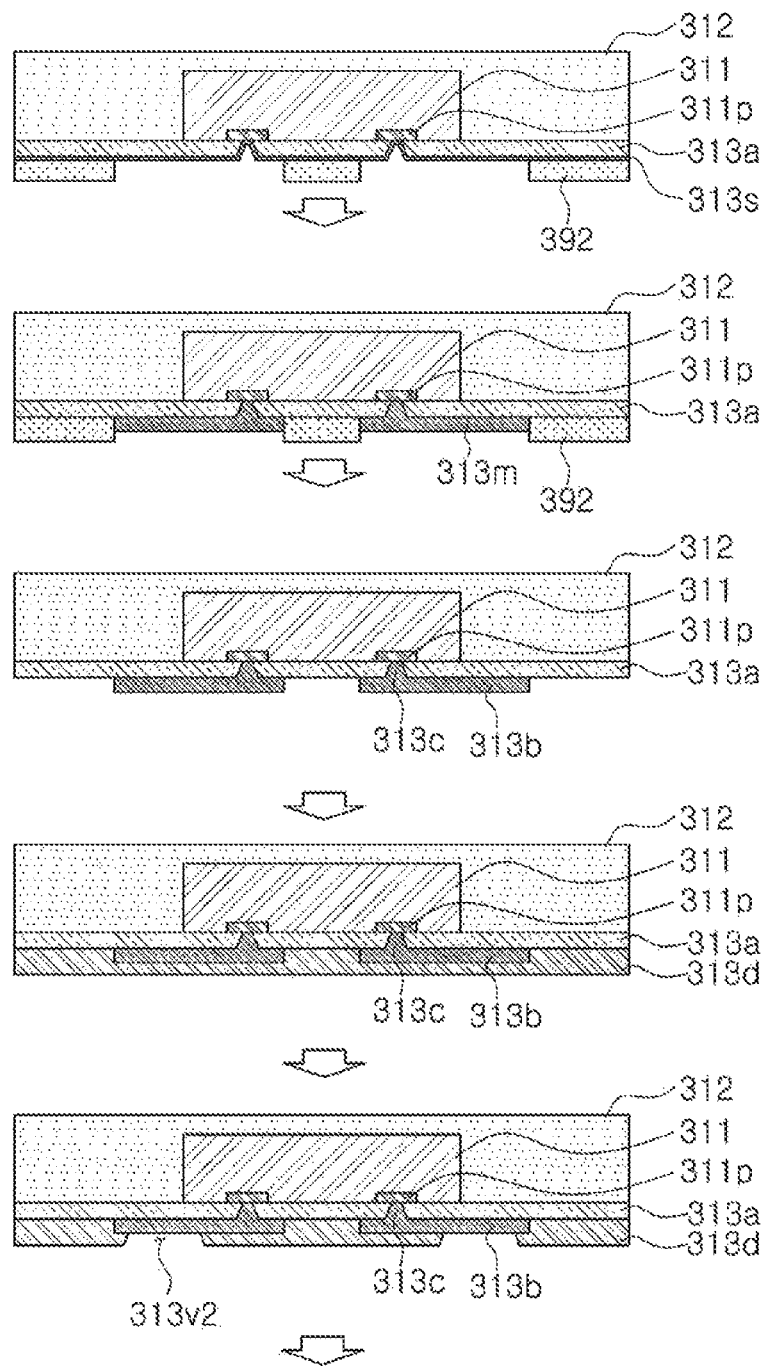
Figure 11C:
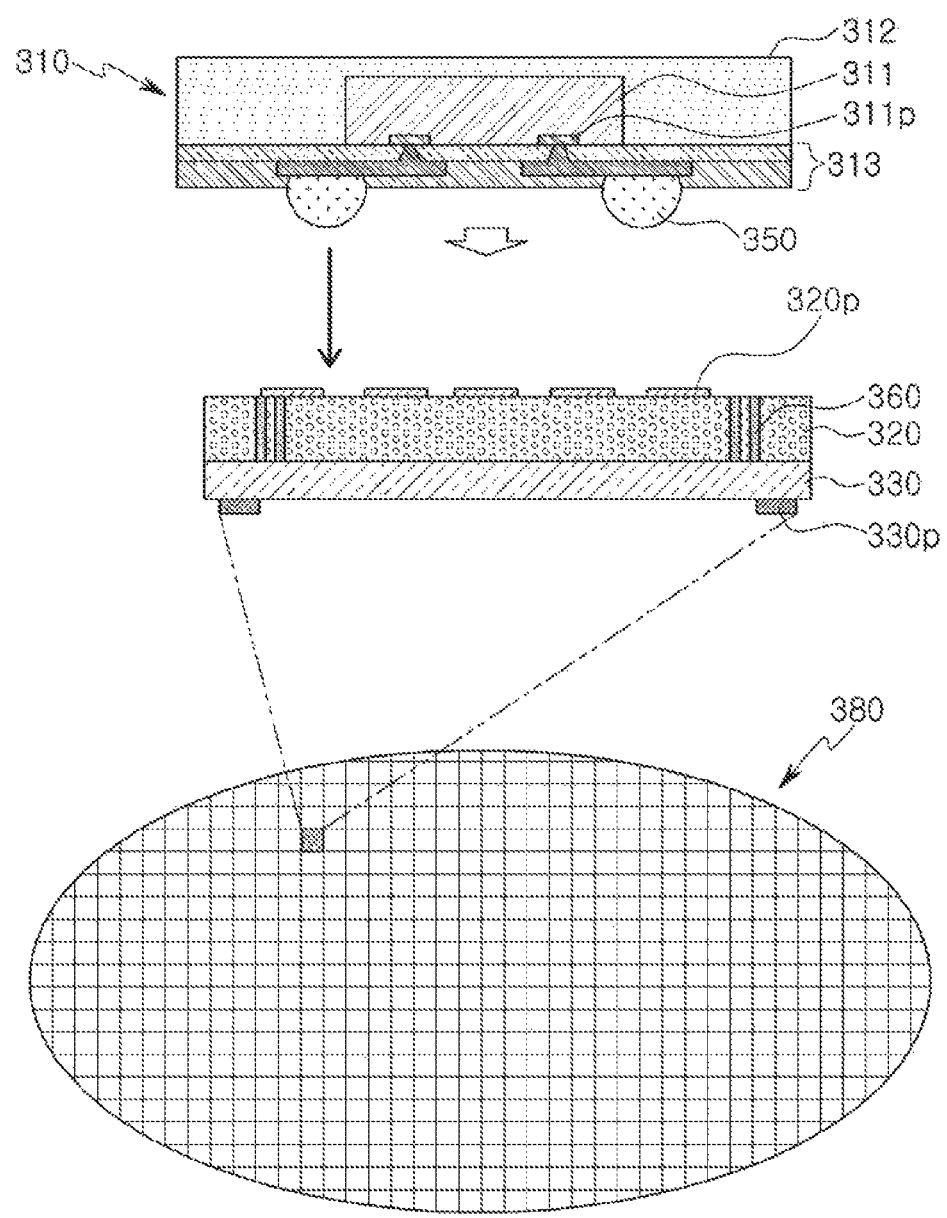

FIGS. 11A through 11C are schematic manufacturing examples of the image sensor device of FIG. 9.

Referring to FIG. 11A, the plurality of first semiconductor chips 311 may be first formed using a wafer or the like, and then each of the first semiconductor chips 311 obtained by cutting the wafer may be attached to a tape 391. Thereafter, the sealing material 312 for sealing at least a portion of the first semiconductor chip 311 may be formed by the known lamination method, coating method or the like. Thereafter, the tape 391 may be removed. Thereafter, the insulating layer 313a may be formed on the active surface of the first semiconductor chip 311 from which the tape 391 is removed. The insulating layer 313a may be the known PID or the like, and may be formed by the known lamination method, coating method, or the like. Thereafter, a via hole 313v1 may be formed in the insulating layer 313a by an exposure and development method or the like. Thereafter, a seed layer 313s may be formed on the insulating layer 313a by a deposition method such as sputtering.

Next, referring to FIG. 11B, a pattern may be formed using a photoresist 392. Thereafter, a plating layer 313m may be formed on the formed pattern by the known plating process such as electrolytic plating or electroless plating. Thereafter, the photoresist 392 and the seed layer 313s may be removed by etching or the like. The redistribution layer 313b and the via 313c may be formed by a series of processes. Thereafter, the passivation layer 313d may be formed on the insulating layer 313a by the known lamination method, coating method or the like. Thereafter, an opening 313v2 may be formed on the passivation layer 313d. The openings 313v2 may be formed using an exposure and development method or a laser and/or a mechanical drill or the like depending on the material of the passivation layer 313d. The fan-out semiconductor package 310 may be manufactured by a series of processes.

Referring to FIG. 11C, the connector 350 such as the solder bump may be formed in the opening 313v2. Thereafter, the fan-out semiconductor package 310 may be attached to the second semiconductor chip 320 and the third semiconductor chip 330, which are formed by using the wafer 380, by TC bonding or the like using the connector 350. Meanwhile, the fan-out semiconductor package 310 may be attached to the wafer 380 in which the plurality of second semiconductor chips 320 and third semiconductor chips 330 are integrally formed by a single process. Thereafter, if the fan-out semiconductor package 310 suffers from the dicing process such as sawing, the plurality of image sensor devices 300 may be obtained.

Figure 12:
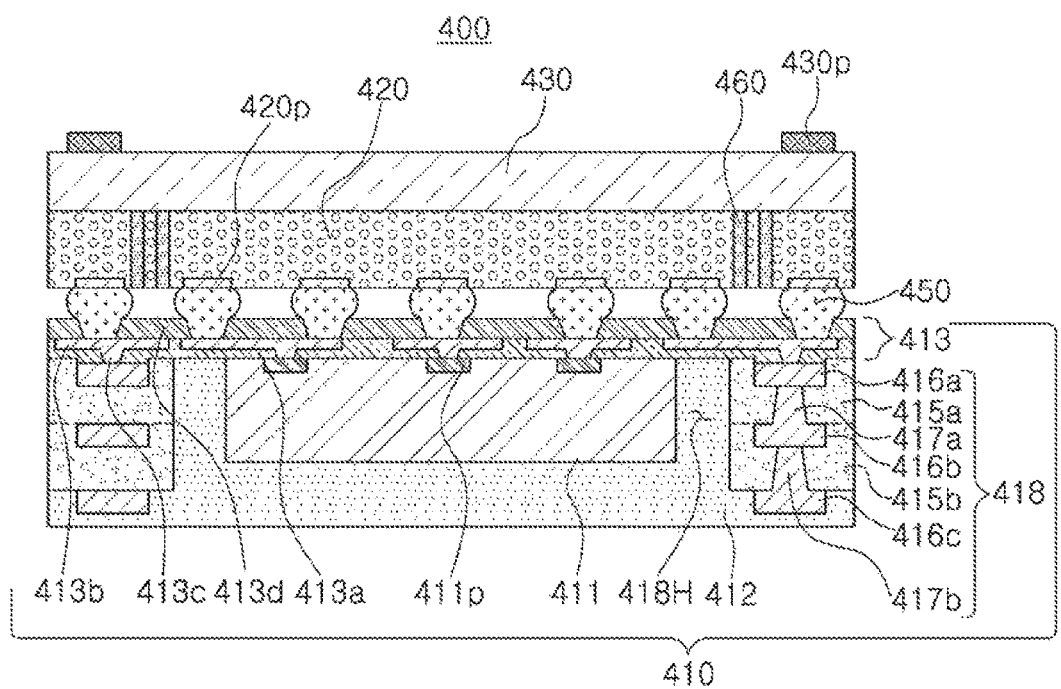
FIG. 12 is a cross-sectional view schematically illustrating an image sensor device according to another example.

FIG. 12 is a cross-sectional view schematically illustrating an image sensor device according to another example.

Referring to FIG. 12, in the image sensor device 400 according to another example, the fan-out semiconductor package 410 may include a first connection member 418 having a through hole 418H, a first semiconductor chip 411 disposed in the through hole 418H and having an active surface on which a connection pad 411p is disposed and an inactive surface disposed on an opposite surface to the active surface, a second connection member 413 formed on the first connection member 418 and the active surface of the first semiconductor chip 411, and a sealing material 412 formed on the second connection member 413 and sealing at least a part of the first connection member 418 and the first semiconductor chip 411. The first semiconductor chip 411 may be a memory but is not limited thereto.

The first connection member 418 includes a first insulating layer 415a, a first redistribution layer 416a embedded in the first insulating layer 415a and contacting the second connection member 413, a second redistribution layer 416b disposed on an opposite side to the side where the first redistribution layer 416a is embedded in the first insulating layer 415a, a second insulating layer 415b disposed on the first insulating layer 415a and covering the second redistribution layer 416b, and a third redistribution layer 416c disposed on the second insulating layer 415b. The first and second redistribution layers 416a and 416b may be connected to each other through a first via 417a penetrating through the first insulating layer 415a. The second and third redistribution layers 416a and 416c may be connected to each other through a second via 417b penetrating through the second insulating layer 415b. The first connection member 418 may include the redistribution layers 416a, 416b, and 416c, and therefore the connection pad 411p of the first semiconductor chip 411 may be redistributed and the number of layers of the second connection member 413 may be minimized.

The first redistribution layer 416a may be recessed into the first insulating layer 415a so that a lower surface of the first insulating layer 415a may have a step from a lower surface of the first redistribution layer 416a. In this case, it is possible to prevent the first redistribution layer 416a from being contaminated due to bleeding of a precursor of the sealing material 412. The second redistribution layer 416b of the first connection member 418 may be located between the active surface and the inactive surface of the first semiconductor chip 411. The thickness of the redistribution layers 416a, 416b, and 416c of the first connection member 418 may be larger than that of the redistribution layer of the second connection member 413.

The second and third semiconductor chips 420 and 430 may be electrically connected to each other through the through electrode 460 and may be physically and electrically connected to the fan-out semiconductor package 410 by the connection member 450. The second and third semiconductor chips 420 and 430 may each have connection pads 420p and 430p. The second and third semiconductor chips 420 and 430 may each be logic and a sensor but are not limited thereto. Other detailed descriptions of the configuration of the image sensor device 400 according to another example are substantially the same as those described in the image sensor device 300 according to the example, and therefore will be omitted. In addition, even the manufacturing process is substantially the same as that described above except for the introduction of the first connection member 418, and a detailed description thereof will also be omitted.

Figure 13:
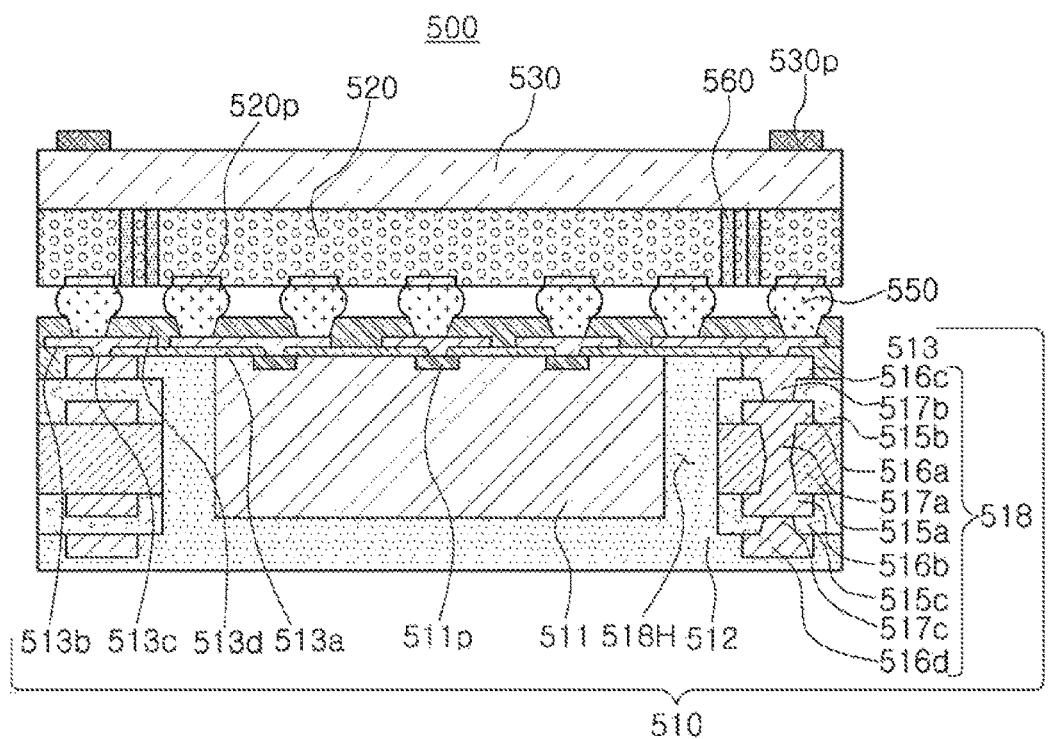
FIG. 13 is a cross-sectional view schematically illustrating an image sensor device according to another example.

FIG. 13 is a cross-sectional view schematically illustrating an image sensor device according to another example.

Referring to FIG. 13, in the image sensor device 500 according to another example, the fan-out semiconductor package 510 may include a first connection member 518 having a through hole 518H, a first semiconductor chip 511 disposed in the through hole 518H and having an active surface on which a connection pad 511p is disposed and an inactive surface disposed on an opposite surface to the active surface, a second connection member 513 formed on the first connection member 518 and the active surface of the first semiconductor chip 511, and a sealing material 513 formed on the second connection member 513 and sealing at least a part of the first connection member 518 and the first semiconductor chip 511.

The first connection member 518 may include a first insulating layer 515a, a first redistribution layer 516a and a second redistribution layer 516b disposed on both sides of the first insulating layer 515a, a second insulating layer 515b disposed on the first insulating layer 515a and covering the first redistribution layer 516a, a third redistribution layer 516c disposed on the second insulating layer 515b and contacting the second connection member 513, a third insulating layer 515c disposed on the first insulating layer 515a and covering the second redistribution layer 516b, and a fourth redistribution layer 516d disposed on the third insulating layer 515c. The first through fourth redistribution layers 516a, 516b, 516c and 516d may be connected to each other through first through third vias 517a, 517b, and 517c penetrating through the first through third insulating layers 515a, 515b, and 515c. The first connection member 518 may include the redistribution layers 516a, 516b, 516c, and 516d and therefore the connection pad 511p of the first semiconductor chip 511 may be redistributed and the number of layers of the second connection member 516 may be minimized.

The thickness of the first insulating layer 515a may be larger than that of the second insulating layer 515b and the third insulating layer 515c. Basically, the first insulating layer 515a may be relatively thick to maintain rigidity and the second insulating layer 515b and the third insulating layer 515c may be introduced to form a larger number of redistribution layers 516c and 516d. That is, the first insulating layer 515a may include an insulating material different from that of the second insulating layer 515b and the third insulating layer 515c. For example, the first insulating layer 515a may be, for example, a prepreg including a glass fiber, an inorganic filler, and an insulating resin, and the second insulating layer 515b and the third insulating layer 515c may be ABF or PID including an organic filler and an insulating resin but the material of the first insulating layer 515a is not limited thereto. The first redistribution layer 516a and the second redistribution layer 516b of the first connection member 518 may be located between the active surface and the inactive surface of the first semiconductor chip 511. The thickness of the redistribution layers 516a, 516b, 516c, and 516d of the first connection member 518 may be larger than that of the redistribution layer of the second connection member 513.

The second and third semiconductor chips 520 and 530 may be electrically connected to each other through the through electrode 560 and may be physically and electrically connected to the fan-out semiconductor package 510 by the connection member 550. The second and third semiconductor chips 520 and 530 may each have connection pads 520p and 530p. The second and third semiconductor chips 520 and 530 may each be logic and a sensor but are not limited thereto. Other detailed descriptions of the configuration of the image sensor device 500 according to another example are substantially the same as those described in the image sensor device 300 according to the exemplary embodiment in the present disclosure, and therefore will be omitted. In addition, even the manufacturing process is substantially the same as that described above except for the introduction of the first connection member 518, and a detailed description thereof will also be omitted.

Image Sensor Module

Figure 14:
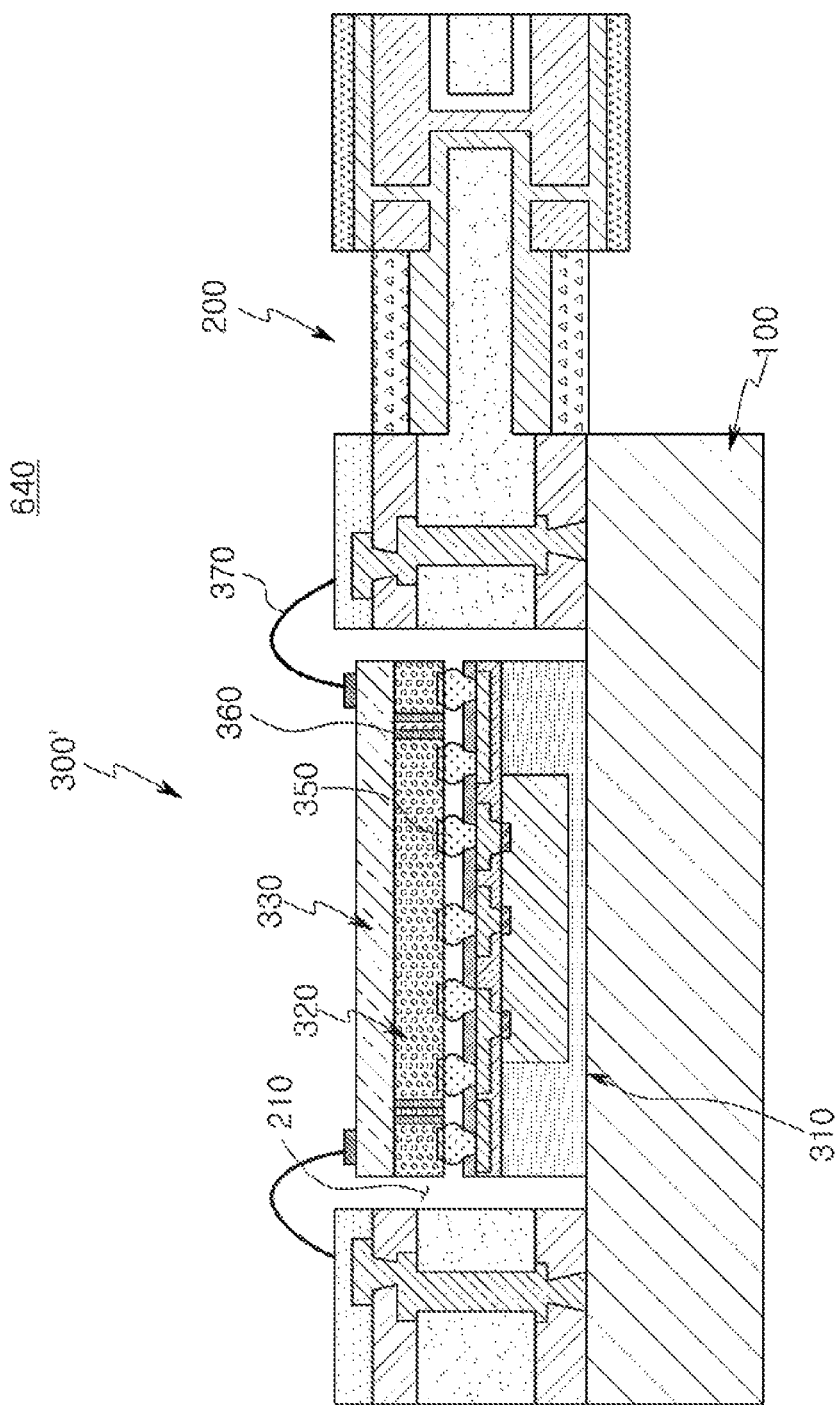
FIG. 14 is a cross-sectional view schematically illustrating an image sensor module according to an example.

FIG. 14 is a cross-sectional view schematically illustrating an image sensor module according to an example.

Referring to FIG. 14, an image sensor module 640 according to an example includes a circuit board 200 having a through hole 210 while being formed with a circuit pattern and an image sensor device 300' disposed in the through hole 210 of the circuit board 200 and electrically connected to a circuit pattern of the circuit board 200. If necessary, the image sensor module 640 according to the example may further include a reinforcing plate 100 disposed under the circuit board 200. The image sensor device 300' may be attached to the reinforcing plate 100 in the through hole 210.

The reinforcing plate 100 may be attached to the lower side of the circuit board 200. For example, the reinforcing plate 100 may be attached to the lower side of the circuit board 200 by an adhesive. The reinforcing plate 100 may support the image sensor device 300'. It is possible to prevent the circuit board 200 from being warped when the image sensor device 300' is disposed in the through hole 210 according to the material of the reinforcing plate 100. The reinforcing plate 100 may be formed of stainless steel but is not limited thereto, and therefore may also be formed of an insulating material. If necessary, the reinforcing plate 100 may be omitted in accordance with a method of forming a through hole 210. For example, if the through hole 210 is formed in a recessed form to penetrate through only a part of the circuit board 200, the separate reinforcing plate 100 may be omitted.

The circuit board 200 may be the known printed circuit board used for the camera module or the like. For example, the circuit board 200 may be a rigid-flexible printed circuit board (RFPCB) that a rigid printed circuit board (RPCB) and a flexible printed circuit board (FPCB) are bonded to each other. The through hole 210 may be formed on the rigid printed circuit board (RPCB), and the reinforcing plate 100 may also be attached to a lower side of a rigid printed circuit board (RPCB).

The image sensor device 300' may be disposed in the through hole 210 of the circuit board 200 to be attached to the reinforcing plate 100. The image sensor device 300' may be electrically connected to the circuit pattern of the circuit board 200. For example, the image sensor device 300' may be the image sensor device 300 according to the foregoing example. In this case, the image sensor device 300' may be electrically connected to the circuit pattern of the circuit board 200 by the method of connecting a connection pad 330p of a third semiconductor chip 330, which may be a image sensor, to a circuit pattern of a circuit board 200 by a wire 370. However, the connection method is not necessary limited thereto and therefore the image sensor device 300' may be electrically connected to the circuit pattern of the circuit board 200 by other methods according to the method of disposing an image sensor device 300' in a circuit board 200. Meanwhile, unlike the device shown in the drawings, as the image sensor device 300', an image sensor device 400 or 500 according to another example described above may also be applied.

Camera Module

Figure 15:
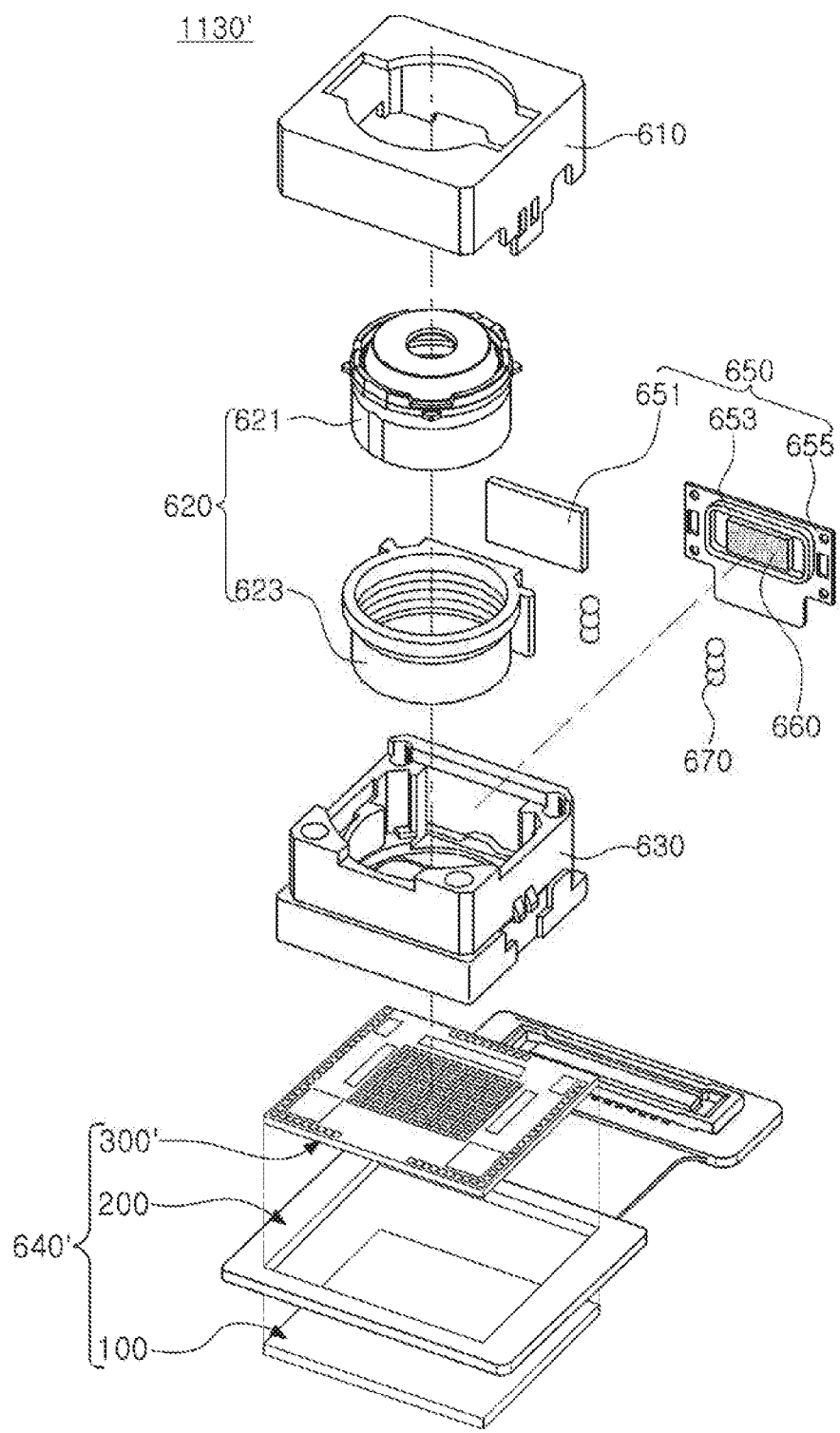
FIG. 15 is a cross-sectional view schematically illustrating a camera module according to an example.

FIG. 15 is a cross-sectional view schematically illustrating a camera module according to an example.

Referring to FIG. 15, a camera module 1130' according to an example may include a housing 630 housing a lens module 620 and an image sensor module 640' coupled to the housing 630 and including the image sensor device 300' converting light passing through a lens module 620 into an electric signal. In addition, the camera module 1130' according to the example may include an actuator 650, a ball bearing 670, a case 610, and a controller 660 or the like. Meanwhile, as the image sensor module 640', the image sensor module 640 according to the foregoing example may be applied. Hereinafter, the remaining components other than the image sensor module 640' will be described.

The lens module 620 may include a lens barrel 621 and a lens holder 623 having the lens barrel 621 received therein. The lens barrel 621 may have a hollow cylindrical shape so that a plurality of lenses photographing a subject may be received therein, in which the plurality of lenses may be provided in the lens barrel 621 along an optical axis. The plurality of lenses may be stacked by the required number according to a design of the lens module 620, and the respective lenses may have optical characteristics such as the same refractive index and different refractive indices. The lens barrel 621 may be coupled to the lens holder 623. For example, the lens module 621 may be inserted into a hollow provided in the lens holder 623 and the lens barrel 621 and the lens holder 623 may be coupled to each other by a screw fastening manner or an adhesive.

The lens module 620 may be received in the housing 630 and may move in an optical axis direction for automatic focus adjustment. To this end, the actuator 650 may be provided. The actuator 650 may include a magnet 651 mounted on one side of the lens holder 623 and a coil 653 arranged to face the magnet 651 to move the lens module 620 in the optical axis direction. The coil 653 may be mounted on a substrate 655 that may be mounted in the housing 630 so that the coil 653 faces the magnet 651.

The coil 653 may move the lens module 620 in the optical axis direction by an electromagnetic influence with adjacent magnets 651. That is, if the magnet 651 forms a magnetic field and power is applied to the coil 653, a driving force may be generated by the electromagnetic influence between the magnet 651 and the coil 653 to move the lens module 620 in the optical axis direction.

The controller 660 may include a driver IC and a position sensor, and may control the operation of the actuator 650. The position sensor may detect the position of the magnet 651 and thus detect the position of the lens module 620 on which the magnet 651 is mounted. The position sensor may be disposed at a center of the donut-shaped coil 653 or on an external surface of the coil 653. The driver IC and the position sensor may be integrally formed as one element, but are not necessarily formed integrally, and therefore the driver IC and the position sensor may be provided as separate elements.

If the lens module 620 moves in the optical axis direction within the housing 630, a ball bearing part 670 may be provided as a guide means for guiding the movement of the lens module 620. The ball bearing part 670 may include at least one ball bearing, and if a plurality of ball bearings are provided, the plurality of ball bearings may be disposed in the optical axis direction. Here, the plurality of ball bearings may be disposed apart from each other in the direction perpendicular to the optical axis direction with respect to the magnet 651. The ball bearing part 670 may be in contact with an outer surface of the lens holder 623 and an inner surface of the housing 630 to guide the movement of the lens module 620 in the optical axis direction. The ball bearing part 670 may be disposed between the lens holder 623 and the housing 630 to guide the movement of the lens module 620 in the optical axis direction by a rolling motion.

A stopper (not shown) may be mounted on the housing 630 to limit a moving distance of the lens module 620. For example, the stopper (not shown) may be mounted on an upper portion of the housing 630, and the stopper (not shown) and the lens module 620 may be disposed to be spaced apart from each other in the optical axis direction if power is not applied to the coil 653. If power is applied to the coil 653 and thus the lens module 620 moves in the optical axis direction, the movement distance of the lens module 620 may be limited by the stopper (not shown), and therefore the lens module 620 may move within a distance from the stopper (not shown). Further, the stopper (not shown) may be provided as a material having elastic force to relieve the impact in the case that the stopper (not shown) and the lens module 620 collide with each other.

The case 610 may be coupled to the housing 630 to enclose the outer surface of the housing 630, and may serve to shield electromagnetic waves generated while the camera module is being driven. That is, the electromagnetic waves may be generated when the camera module is driven and the electromagnetic waves discharged to the outside may have an influence on other electronic components to thereby cause the communications error or the malfunction. The case 610 may be formed of a metal material and may be grounded to a ground pad of the substrate mounted on the lower portion of the housing 630, thereby shielding the electromagnetic waves. If the case 610 is provided as a plastic injection-molded product, an inner surface of the case 610 may be applied with conductive paint to shield the electromagnetic waves. As the conductive paint, conductive epoxy may be used but the conductive paint is not limited thereto, and therefore various materials having conductivity may be used and a method of attaching a conductive film or a conductive tape to the inner surface of the case 610 may be applied.

As set forth above, according to an exemplary embodiment in the present disclosure, an image sensor device having a new structure capable of realizing miniaturization, high performance, and multifunctionality and an image sensor module comprising the same may be provided.

In the present disclosure, the lower side, the lower portion, the lower surface or the like means the direction toward the mounting surface of the semiconductor device with respect to the cross section of the drawings for convenience, and the upper side, the upper portion, and the upper surface are used in the opposite direction thereto. However, this defines a direction for the convenience of explanation and the scope of claims is not particularly limited to the description of the direction.

The meaning of the connection in the present disclosure includes not only a direct connection but also an indirect connection through an adhesive layer or the like. In addition, the meaning of the electrical connection includes both the physical connection and the non-connection. Also, the expressions of first, second or the like are used to distinguish one component from another, and do not limit the order and/or importance of the corresponding components. In some cases, unless departing from the scope of the right, a first component may be referred to as a second component, and similarly, the second component may be referred to as the first component.

The expression of an example used in the present disclosure does not mean the same embodiment but is provided to intensively describe different unique features. However, the above-mentioned examples do not exclude that they are implemented in combination with the features of other examples. For example, although the description in the specific example is not described in another example, it can be understood as an explanation related to another example, unless otherwise stated or contrary to the description in the other example.

Terms used in the present disclosure are used only in order to describe specific embodiments rather than limiting the present disclosure. Singular forms used herein are intended to include plural forms unless context explicitly indicates otherwise.

What is claimed is:
1. An image sensor device, comprising:
 a fan-out semiconductor package including a first semiconductor chip having an active surface on which a connection pad is disposed, a first connection member disposed on the active surface of the first semiconduc- tor chip and including a redistribution layer electrically connected to the connection pad of the first semiconductor chip, and a sealing material disposed on the first connection member and sealing at least a portion of the first semiconductor chip;
a second semiconductor chip disposed on the first connection member and electrically connected to the first connection member; and
a third semiconductor chip disposed on the second semiconductor chip and electrically connected to the second semiconductor chip,
wherein at least one of the second semiconductor chip or the third semiconductor chip is an image sensor.

2. The image sensor device of claim 1, wherein the first semiconductor chip is a memory chip, the second semiconductor chip is logic chip, and the third semiconductor chip is an image sensor.

3. The image sensor device of claim 1, wherein the first semiconductor chip has an area smaller than that of the second and third semiconductor chips.

4. The image sensor device of claim 1, wherein the first connection member and the second semiconductor chip are electrically connected to each other by a connector disposed between the first connection member and the second semiconductor chip, and
the second semiconductor chip and the third semiconductor chip are electrically connected to each other through a through electrode penetrating through at least a part of the second semiconductor chip.

5. The image sensor device of claim 4, wherein the second semiconductor chip and the third semiconductor chip each have an active surface on which a connection pad is disposed and an inactive surface opposing the active surface, and
the inactive surface of the second semiconductor chip is in contact with the inactive surface of the third semiconductor chip.

6. The image sensor device of claim 4, wherein the second semiconductor chip and the third semiconductor chip are integrated in a same semiconductor substrate.

7. The image sensor device of claim 1, wherein the fan-out semiconductor package further includes a second connection member disposed on the first connection member and having a through hole, and
the first semiconductor chip is disposed in the through hole.

8. The image sensor device of claim 7, wherein the second connection member includes a redistribution layer electrically connected to the connection pad of the first semiconductor chip.

9. The image sensor device of claim 7, wherein the second connection member includes a first insulating layer, a first redistribution layer contacting the first connection member and embedded in the first insulating layer, and a second redistribution layer disposed on an opposite side to the side where the first redistribution layer is embedded in the first insulating layer.

10. The image sensor device of claim 9, wherein the second connection member further includes a second insulating layer disposed on the first insulating layer and covering the second redistribution layer and a third redistribution layer disposed on the second insulating layer.

11. The image sensor device of claim 9, wherein a lower surface of the first insulating layer has a step from a lower surface of the first redistribution layer.

12. The image sensor device of claim 7, wherein the second connection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer.

13. The image sensor device of claim 12, wherein the second connection member further includes a third insulating layer disposed on the first insulating layer and covering the second redistribution layer and a fourth redistribution layer disposed on the third insulating layer.

14. The image sensor device of claim 12, wherein the first insulating layer is thicker than the second insulating layer.

15. An image sensor module, comprising:
a circuit board having a through hole while being formed with a circuit pattern; and
an image sensor device disposed in the through hole of the circuit board and electrically connected to the circuit pattern of the circuit board,
wherein the image sensor device includes:
a fan-out semiconductor package including a first semiconductor chip having an active surface on which a connection pad is disposed, a first connection member disposed on the active surface of the first semiconductor chip and including a redistribution layer electrically connected to the connection pad of the first semiconductor chip, and a sealing material disposed on the first connection member and sealing at least a portion of the first semiconductor chip;
a second semiconductor chip disposed on the first connection member and electrically connected to the first connection member; and
a third semiconductor chip disposed on the second semiconductor chip and electrically connected to the second semiconductor chip, and
at least one of the second semiconductor chip or the third semiconductor chip is an image sensor.

16. The image sensor module of claim 15, further comprising:
a reinforcing plate disposed at a lower side of the circuit board,
wherein the image sensor device is attached to the reinforcing plate within the through hole.

17. The image sensor module of claim 15, wherein the second and third semiconductor chips each have an active surface on which a connection pad is disposed and an inactive surface opposing the active surface,
the inactive surface of the second semiconductor chip is in contact with the inactive surface of the third semiconductor chip, and
the connection pad of the third semiconductor chip is electrically connected to the circuit pattern of the circuit board by wire bonding.

* * * * *